United States Patent [19]

Greenwood

[11] 4,229,979
[45] Oct. 28, 1980

[54] TRANSDUCER AND METHOD OF MAKING THE SAME

[75] Inventor: John C. Greenwood, Harlow, England

[73] Assignee: International Standard Electric Corporation, New York, N.Y.

[21] Appl. No.: 43,446

[22] Filed: May 29, 1979

[30] Foreign Application Priority Data

May 30, 1978 [GB] United Kingdom ............... 24186/78

[51] Int. Cl.³ ............................................ G01L 11/00
[52] U.S. Cl. ...................................... 73/704; 73/723; 73/778
[58] Field of Search .................. 73/704, 702, 778, 723

[56] References Cited

U.S. PATENT DOCUMENTS

| 3,399,572 | 9/1968 | Riordan | 73/704 |
| 3,672,220 | 6/1972 | Agar | 73/704 |
| 4,074,576 | 2/1978 | Bryzzhev et al. | 73/702 |

FOREIGN PATENT DOCUMENTS 1483344  8/1977  United Kingdom ................. 73/702

Primary Examiner—Donald O. Woodiel
Attorney, Agent, or Firm—A. Donald Stolzy

[57] ABSTRACT

A silicon transducer including a silicon frame with one or more lands extending from a diaphragm or the like. The lands are interconnected by two thin strips formed integrally with the lands. The strips are essentially the transducer. The transducer is constructed by etching a boron doped wafer with a mixture of catechol, ethylene diamine and water.

2 Claims, 4 Drawing Figures

TRANSDUCER AND METHOD OF MAKING THE SAME

BACKGROUND OF THE INVENTION

This invention relates to transducers, and more particularly to electrical semiconductor transducers of the acoustic type.

SUMMARY OF THE INVENTION

According to one aspect of the invention there is provided a pressure transducer, including a flexible diaphragm supported in a frame of the same material as the diaphragm, first and second lands extending from one surface of the diaphragm, and a plurality of semiconductor filaments stretched between and formed integral with the lands, the device being so constructed that changes in the configuration of the diaphragm cause corresponding changes in the tension of the filaments and hence changes in natural and/or resonant frequency of vibration.

The principle on which the transducer functions is analogous to the variation with tension of the resonant frequency of a stretched string. The resonant frequency of such a transducer is a direct function of an applied force with temperature variation a second order effect. The electrical output of the transducer is in a form particularly suitable for signal processing by logic circuitry or by a microprocessor.

BRIEF DESCRIPTION OF THE DRAWINGS

In the accompanying drawings which illustrate exemplary embodiments of the present invention.

DESCRIPTION OF THE PREFERRED EMBODIMENT

Figure 1:
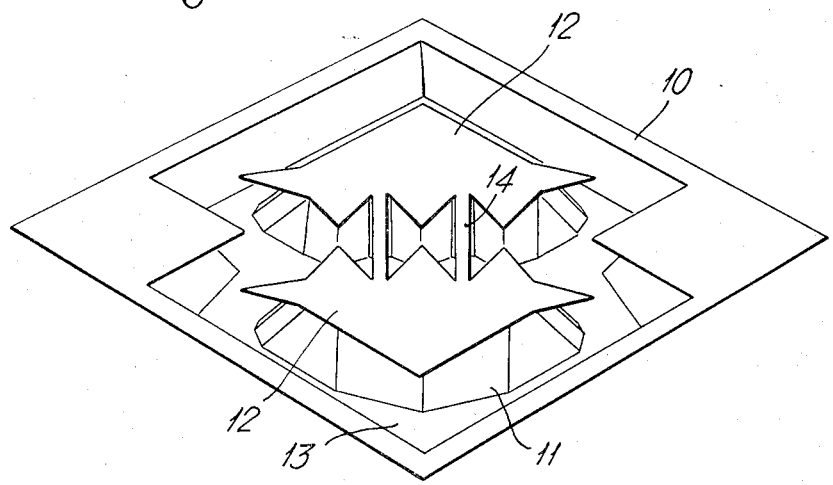
FIG. 1 is a perspective view of a semiconductor resonant filament transducer.
Figure 2:
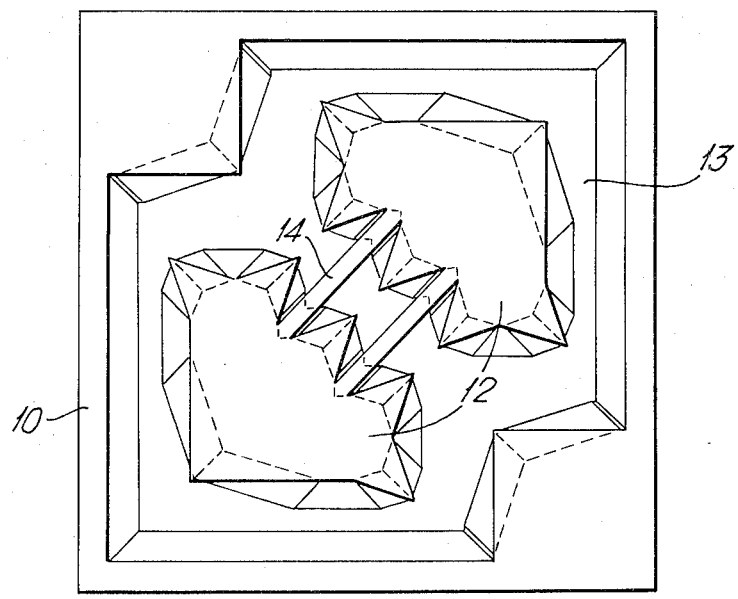
FIG. 2 is a top plan view of the transducer of FIG. 1.

Referring to FIGS. 1 and 2, a transducer 11 is shown which is formed by selective etching of a silicon wafer doped with boron.

In FIG. 2 parts that remain after the etching process are shown.

The fabrication of selectively etched silicon devices depends upon the phenomenon of inhibition of certain etching steps by a concentration of dopant boron higher than $4 \times 10^{19}$ atoms/cc. There is an abrupt change in the etch rate from that normal for undoped silicon to substantially zero at this boron concentration level so that the thickness of an unetched region is defined precisely by the boron diffusion depth. The process is more fully described in U.K. Specification No. 1,211,496 (J. C. Greenwood 6). The wafer is doped through a mask with boron in those areas in which etching is not required, and the wafer is then etched with a mixture of catechol, ethylene diamine and water to form the transducer structure shown in FIGS. 1 and 2.

The transducer 11 includes a pair of lands 12 (as opposed to grooves) protruding from a silicon diaphragm 13 supported in a rectangular silicon frame 10 and linked by a pair of filaments 14 when pressure is applied.

In practice of course a plurality of such devices is disposed on a silicon wafer.

As, contrary to conventional semiconductor fabrication techniques, both major surfaces of the semiconductor wafer are etched, means must be provided for handling a process wafer by its rim portions only. Thus the transducers formed on a wafer must be disposed towards the central region leaving the rim portion free.

In the apparatus used for the etching process, the silicon wafer on which the devices are to be formed is mounted by its rim portion on a glass carrier and is then sealed via an O-ring against a shoulder at one end of a tube. A clamp ring or gland nut metal with a reverse thread on the tube secures the wafer in position. Etch solution can then be poured into the cup thus formed and act on one side only of the wafer. In some applications the glass carrier may be replaced by a vacuum chuck arrangement.

In a typical transducer fabrication process, the silicon wafer is cleaned in hydrofluoric acid, caro's acid and water and is then treated to a boron diffusion from both sides. The front of the wafer is masked with an evaporated aluminum layer with the reverse face masked and etched in a phosphoric acid etch to define the face of the diaphragm. The aluminum coating has a photoresist on it, and is etched with a phosphoric and/or nitric acid mixture. The silicon is etched by plasma etching to a depth greater than has been rendered insoluble in a selective etch by the boron diffusion. This is done on both sides of the slice, which is then etched in a selective etch to define the first configuration of the device.

The various etching techniques will be apparent to those skilled in the art, but the following rules should be observed:

1. The etch rate of catechol-diamine-water is substantially slower in the $<111>$ crystallographic direction than in any other. To a first approximation the rate in the $<111>$ direction can be regarded as zero.

2. A concave face tends to be opened up to give a hollow bounded by the slowest etching $<111>$ (octahedral) faces; thus a pinhole in a protective oxide coating on a $<111>$ orientation slice gives rise to a square pyramidal etch pit.

3. A convex face tends to give a solid bounded by the fastest etching faces which are the 24 $<331>$ faces.

4. An irregularity, such as might be caused by faulty masking, in a $<111>$ face tends to be straightened out whereas the same sort of irregularity in a fast etching face does not.

5. The cleanest $<331>$ fast etching faces are obtained when one edge only is adjacent to another fast etching face, the other edges being adjacent to unsoluble material of $<111>$ planes. Irregular shapes result from other alignments although not every combination of adjacent faces has been tried.

6. On $<100>$ slices a variety of corner shapes can be obtained by putting compensating spikes on the mask. The angle of the spikes does not appear to be critical although a 1 in 3 slope gives good results. The length of a spike is related to the etch time, which is determined by the thickness of the slice. Normally the etch time should be greater than is needed just to reach the other side, so that any irregularities are cleaned up. If the etch time is 20% greater than is needed to reach the other side, a nearly square corner is obtained by making the length of the spike 20% longer than the thickness of the slice. If no spike is used, the corner is chamfered. Intermediate sized spikes give intermediate results.

7. If a part of the surface is to be undercut, care has to be taken that this process is not stopped by <111> faces. For example if a bridge is to be undercut on a <100> orientation slice, the bridge must be at an angle to the <111> faces and must be sufficiently narrow.

Figure 3:
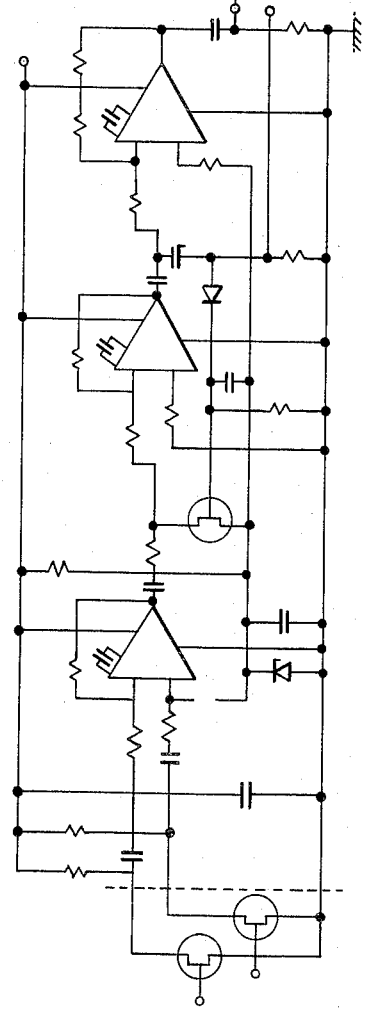
FIG. 3 is a cross-sectional view of the transducer taken through a resonant filament.
Figure 3:
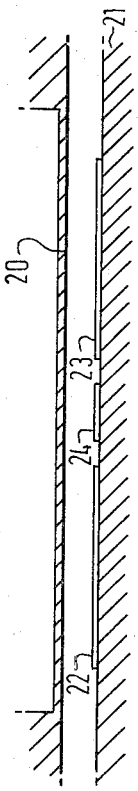

In FIG. 3, which is a cross section of part of the transducer, we see one of the resonant strips at 20, which is spaced from the lower surface 21 of the device. On the lower surface 21 there are the devices driving electrode 22, its pick-up electrode 23, and a guard electrode 24 therebetween.

In use the transducer, which functions as a pressure gauge, is mounted by its rim or frame against a source of pressure to be measured. The filaments are excited at their resonant vibrational frequency, e.g. by a circuit of the type shown in FIG. 4, this frequency being determined by the pressure difference across the diaphragm. Changes in pressure cause corresponding changes in the tension of the filament 14 and hence changes in their resonant frequency.

Figure 4:
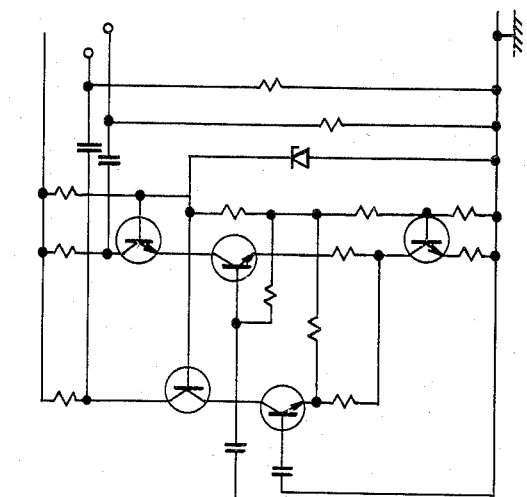
FIG. 4 is a schematic diagram of an oscillator drive circuit for use with the transducer.

Conveniently the transducer may be excited electrostatically, the circuit of FIG. 4 being intended for this purpose, as this provides substantially no damping of the filament.

To reduce the capacitive coupling between input and output to a minimum, two resonant strips, as shown in FIGS. 1 and 2, are used, those being driven in antiphase. The preamplifier FET's are mounted on the transducer itself. The circuit of FIG. 4 shows amplifier stages which give an overall gain of about 100. The second of these stages is an AGC stage and the third is a phase splitter with unity gain. The fourth stage is an optional stage to get an increased amplitude output.

What is claimed is:

1. A pressure transducer comprising: a flexible diaphragm supported in a frame of the same material as the diaphragm; first and second lands extending from one surface of said diaphragm; a plurality of filaments stretched and fixed between said lands; and means to vibrate said filaments at their respective resonant frequencies as determined by the configuration of said diaphragm, movement of said diaphragm producing movements of said lands toward and away from each other, said movements respectively causing stresses, strains and therefore lengthwise contractions and elongations of said filaments and thereby respective lowering and raising of the tensions in and the resonant frequencies of said filaments.

2. A transducer as claimed in claim 1, in which said material is silicon.

* * * * *